United States Patent
Riordon

(10) Patent No.: US 8,377,739 B2
(45) Date of Patent: Feb. 19, 2013

(54) CONTINUOUSLY OPTIMIZED SOLAR CELL METALLIZATION DESIGN THROUGH FEED-FORWARD PROCESS

(75) Inventor: Benjamin Riordon, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/300,125

(22) Filed: Nov. 18, 2011

(65) Prior Publication Data

US 2012/0064662 A1   Mar. 15, 2012

Related U.S. Application Data

(62) Division of application No. 12/754,712, filed on Apr. 6, 2010, now Pat. No. 8,084,293.

(51) Int. Cl.
*H01L 21/00*   (2006.01)
(52) U.S. Cl. .......................................... 438/98; 438/533
(58) Field of Classification Search .................. 438/98, 438/523, 533
See application file for complete search history.

(56) References Cited

U.S. PATENT DOCUMENTS

| | | | |
|---|---|---|---|
| 6,825,104 B2 * | 11/2004 | Horzel et al. | 438/547 |
| 7,517,709 B1 | 4/2009 | Borden | |
| 8,048,814 B2 * | 11/2011 | Meisel et al. | 438/781 |
| 2007/0169806 A1 | 7/2007 | Fork et al. | |
| 2009/0056807 A1 | 3/2009 | Chen et al. | |
| 2009/0308440 A1 * | 12/2009 | Adibi et al. | 136/255 |
| 2010/0282310 A1 * | 11/2010 | Tsoi et al. | 136/255 |
| 2011/0146747 A1 * | 6/2011 | Hieslmair | 136/244 |
| 2011/0247688 A1 * | 10/2011 | Yoon et al. | 136/256 |
| 2012/0040490 A1 | 2/2012 | Gallazzo et al. | |
| 2012/0100666 A1 | 4/2012 | Gee et al. | |

FOREIGN PATENT DOCUMENTS

| | | | |
|---|---|---|---|
| DE | 102009018653 A1 | | 9/2010 |
| WO | WO 2009022945 A1 * | | 2/2009 |
| WO | 102007059486 A1 | | 6/2009 |
| WO | 2009155498 A2 | | 12/2009 |
| WO | WO 2009155498 A2 * | | 12/2009 |
| WO | 2010068331 A1 | | 6/2010 |

* cited by examiner

*Primary Examiner* — Fernando L Toledo
*Assistant Examiner* — Bryan Junge

(57) ABSTRACT

An improved, lower cost method of processing substrates, such as to create solar cells, is disclosed. The doped regions are created on the substrate, using a mask or without the use of lithography or masks. After the implantation is complete, visual recognition is used to determine the exact region that was implanted. This information can then be used by subsequent process steps to crate a suitable metallization layer and provide alignment information. These techniques can also be used in other ion implanter applications. In another aspect, a dot pattern selective emitter is created and imaging is used to determine the appropriate metallization layer.

7 Claims, 13 Drawing Sheets

CONTINUOUSLY OPTIMIZED SOLAR CELL METALLIZATION DESIGN THROUGH FEED-FORWARD PROCESS

CROSS-REFERENCE TO RELATED APPLICATIONS

This is a divisional patent application of U.S. patent application Ser. No. 12/754,712 filed Apr. 6, 2010, which is hereby incorporated by reference in its entirety.

BACKGROUND OF THE INVENTION

Solar cells are typically manufactured using the same processes used for other semiconductor devices, often using silicon as the substrate material. A semiconductor solar cell is a device having an in-built electric field that separates the charge carriers generated through the absorption of photons in the semiconductor material. This electric-field is typically created through the formation of a p-n junction (diode) which is created by differential doping of the semiconductor material. Doping a part of the semiconductor substrate (e.g. surface region) with impurities of opposite polarity forms a p-n junction that may be used as a photovoltaic device converting light into electricity.

FIG. 1 shows a cross section of a representative substrate 100, comprising a solar cell. Photons 101 enter the solar cell 100 through the top surface 105, as signified by the arrows. These photons pass through an anti-reflective coating 110, designed to maximize the number of photons that penetrate the substrate 100 and minimize those that are reflected away from the substrate.

Internally, the substrate 100 is formed so as to have a p-n junction 120. This junction is shown as being substantially parallel to the top surface 105 of the substrate 100 although there are other implementations where the junction may not be parallel to the surface. The solar cell is fabricated such that the photons enter the substrate through the n-doped region, also known as the emitter 130. While this disclosure describes p-type bases and n-type emitters, n-type bases and p-type emitters can also be used to produce solar cells and are within the scope of the disclosure. The photons with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron-hole (e-h) pairs need to be separated. This is done through the built-in electric field at the p-n junction. Thus any e-h pairs that are generated in the depletion region of the p-n junction get separated, as are any other minority carriers that diffuse to the depletion region of the device. Since a majority of the incident photons are absorbed in near surface regions of the device, the minority carriers generated in the emitter need to diffuse across the depth of the emitter to reach the depletion region and get swept across to the other side. Thus to maximize the collection of photo-generated current and minimize the chances of carrier recombination in the emitter, it is preferable to have the emitter region 130 be very shallow.

Some photons pass through the emitter region 130 and enter the base 140. These photons can then excite electrons within the base 140, which are free to move into the emitter region 130, while the associated holes remain in the base 140. As a result of the charge separation caused by the presence of this p-n junction, the extra carriers (electrons and holes) generated by the photons can then be used to drive an external load to complete the circuit.

By externally connecting the emitter region 130 to the base 140 through an external load, it is possible to conduct current and therefore provide power. To achieve this, contacts 150, typically metallic, are placed on the outer surface of the emitter region 130 and the base 140. Since the base 140 does not receive the photons directly, typically its contact 150b is placed along the entire outer surface. In contrast, the outer surface of the emitter region 130 receives photons and therefore cannot be completely covered with contacts. However, if the electrons have to travel great distances to the contact, the series resistance of the cell increases, which lowers the power output. In an attempt to balance these two considerations; the distance that the free electrons must travel to the contact, and the amount of exposed emitter surface 160; most applications use contacts 150a that are in the form of fingers. FIG. 2 shows a top view of the solar cell of FIG. 1. The contacts are typically formed so as to be relatively thin, while extending the width of the solar cell. In this way, free electrons need not travel great distances, but much of the outer surface of the emitter is exposed to the photons. Typical contact fingers 150a on the front side of the wafer are between 40 µm and 200 µm. These fingers 150a are typically spaced between 2-3 mm apart from one another. While these dimensions are typical, other dimensions are possible and contemplated herein.

A further enhancement to solar cells is the addition of heavily doped substrate contact regions. FIG. 3 shows a cross section of this enhanced solar cell. The cell is as described above in connection with FIG. 1, but includes heavily n-doped contact regions 170. These heavily doped contact regions 170 correspond to the areas where the metallic fingers 150a will be affixed to the substrate 100. The introduction of these heavily doped contact regions 170 allows much better contact between the substrate 100 and the metallic fingers 150a and significantly lowers the series resistance of the cell. This pattern of including heavily doped regions on the surface of the substrate is commonly referred to as selective emitter design. These heavily doped regions may be created by implanting ions in these regions. Thus, the terms "implanted region" and "doped region" may be used interchangeably throughout this disclosure.

A selective emitter design for a solar cell also has the advantage of higher efficiency cells due to reduced minority carrier losses through recombination due to lower dopant/impurity dose in the exposed regions of the emitter layer. The higher doping under the contact regions provides a field that collects the majority carriers generated in the emitter and repels the excess minority carriers back toward the p-n junction.

In addition to selective emitter designs, other solar cell designs require patterned doping. Another example is the interdigitated back contact (IBC) cell, which requires offset patterns of n-type and p-type dopants on the back side of the cell.

Such structures are typically made using traditional lithography (or hard masks) and thermal diffusion. An alternative is to use implantation in conjunction with a traditional lithographic mask, which can then be removed easily before dopant activation. Yet another alternative is to use a shadow mask or stencil mask in the implanter to define the highly doped areas for the contacts. All of these techniques utilize a fixed masking layer (either directly on the substrate or in the beamline).

All of these alternatives have significant drawbacks. For example, the processes enumerated above all contain multiple process steps. This causes the cost of the manufacturing process to be prohibitive and may increase wafer breakage rates. These options also suffer from the limitations associated with the special handling of solar wafers, such as aligning the mask with the substrate and the cross contamination with materials that are dispersed from the mask during ion implantation.

FIG. 4 shows the typical processing steps required to create patterned doping using a shadow or proximity mask. In step 400, the solar cell is designed. This includes creating the dopant patterns and metallization layers. Based on the desired dopant patterns, a matching proximity mask is design (step 410). Pre-implant manufacturing processes are performed (step 420). For example, in some embodiments, the wafers arrive at the factory as raw sawn wafers. The first step on entering the factory is inspection. The wafers are checked for cracks, resistivity & size. After that, the wafer may go into a series of wet benches. The first wet step may be to remove the saw damage from the wafers. This is typically a 10 um etch from both sides of the wafer to remove the micro-cracks formed by sawing. The next step may be an anisotropic etch that forms the random pyramid texturing on the wafer surfaces. This may help light trapping. The pre-processed wafer is then physically aligned within the ion implanter (step 430). This step also includes precise positioning of the proximity mask. The ion implant of the wafer is then performed, with the proximity mask in place (step 440). After the wafer has been implanted, various post-processing steps, such as anneal and $SiN_x$ deposition, are performed on it (step 450). The wafer is aligned with respect to a reference edge or indicia prior to application of the metallization pattern (step 460). Finally, the metal layer is applied to the wafer (step 470). In the case of a solar cell, the metal layer is typically applied atop the heavily doped regions of the wafer (i.e. those regions implanted during implantation step 440). The final step of fabricating a solar cell is the firing step, where the printed metal is driven in to the cell to make the actual contacts.

However, there are many known problems with the use of a proximity mask, especially in solar cell applications. FIG. 5 shows a wafer 501 being implanted by an ion beam 502, through a proximity mask 503. The mask 503 has a plurality of slots, where each is separated from the adjacent slots by a slot-location spacing 500. The first of these slots is offset from an indicia 504 by a distance 510. The mask 503 has a certain thickness (t) and is offset vertically above the wafer 501 by a gap. As shown in FIG. 5, the ion beam 502 may not be completely orthogonal to the wafer 501. The beam angle (θ), the mask thickness (t) and the gap from the mask 503 to the wafer 501 all have an effect on the location of the implanted regions 505. For example, the greater the gap between the mask 503 and the wafer 501, the more lateral displacement between the desired implant region and the actual implant region 505. Similarly, a thicker mask will tend to reduce the overall width of the implanted region 505, to a width less than the slot width 520. In addition, the use of a proximity mask 503 requires multiple alignment steps. First, the mask 503 must be aligned with the wafer 501. Subsequently, the metal layer has to be aligned as well. FIG. 5 shows the metal 506 applied in the desired location. However, the variability of the steps creates a situation where the metal 506 is not applied over the center of the implanted region 505. The offset from the implanted region 505 to the metal 506 is referred to as feature error, and is shown as being positive on the left side of the implanted region 505 and negative on the right side of the implanted region 505.

In summary, proximity masks can cause the following problems:

Variability of desired feature placement due to machining tolerances;

Variability of feature placement due to incident ion beam angle accuracy (resulting from mask gap or ion beam repeatability);

Variability of feature placement due to wafer positioning;

Variability of feature placement due to wafer size tolerances; and

Tight alignment requirement for the application of metallization.

To accommodate these system tolerances, often the implanted region 505 is larger in size than optimally desired. In the case of selective emitter cells, the oversized implanted regions 505 expand into the emitter region, thereby reducing the surface area of the emitter region. This results in a lower cell efficiency.

FIGS. 6A-C show the impact of these wider implanted regions on a solar cell 600. FIG. 6A shows a typically geometry of a solar cell with busbars 605 and metal fingers 610. FIG. 6B is an expanded view of a portion of FIG. 6A, showing the metal fingers 610, busbar 605 and implanted regions 615 in more detail. To insure that the metal fingers 610 and busbars 605 do not cover the emitter region 620, the implanted regions 615 are created with a greater width than desired. Note that any area which is implanted and not covered by metal is less efficient in capturing solar energy.

FIG. 6C shows a section view of an existing process. The metal finger 610 is located at the leftmost position, based on known tolerances. To insure that the metal finger 610 does not contact the emitter region 620, the implanted region 615 is made wide enough such that in all scenarios, with maximum tolerances and minimum widths, the metal finger is covering only implanted region 615. However, the exposed portions of implanted region 615 are less efficient in capturing solar energy.

In addition, high precision alignment systems and the above described production method is inherently costly. Consequently, efforts have been made to reduce the cost and effort required to dope a pattern onto a solar cell.

Therefore, there exists a need to produce solar cells where the number and complexity of the process steps is reduced, while maintaining adequate accuracy so that subsequent process steps are correctly positioned. While applicable to solar cells, the techniques described herein are applicable to other doping applications.

SUMMARY OF THE INVENTION

An improved, lower cost method of processing substrates, such as to create solar cells, is disclosed. The doped regions are created on the substrate, such as using a mask. In other embodiments, the doped regions are created without the use of lithography or masks. After the implantation is complete, visual recognition is used to determine the exact region that was implanted. This information can then be used by subsequent process steps to crate a suitable metallization layer and provide alignment information. These techniques can also be used in other ion implanter applications.

In another aspect, a dot pattern selective emitter is created and imaging is used to determine the appropriate metallization layer.

DETAILED DESCRIPTION OF THE INVENTION

As described above, current manufacturing processes require precise alignment of implanted regions on the solar cell with the metallization layer. By eliminating this requirement for precision, the manufacturing process can be simplified and made more cost effective.

To reduce this complexity, an image, such as a high resolution image, of the wafer is obtained after the wafer has been implanted. This image may be taken at various points in the process. For example, the image may be taken immediately after ion implantation, after activation (wither with or without oxidation), or after passivation with $SiN_x$. The point in the process at which the image is taken may determine how clearly the implanted regions can be detected. The implanted regions can be differentiated from emitter regions on a high resolution image. This image is then processed to determine the position and sizes of the implanted features. Based on this processing, a metallization layer can be prepared. This metallization layer, which corresponds to the thickness and position of the implanted regions, is then applied to the wafer in a subsequent processing step. In this way, the efficiency of the solar cell is increased, as the emitter region can be maximized.

Figure 7A:
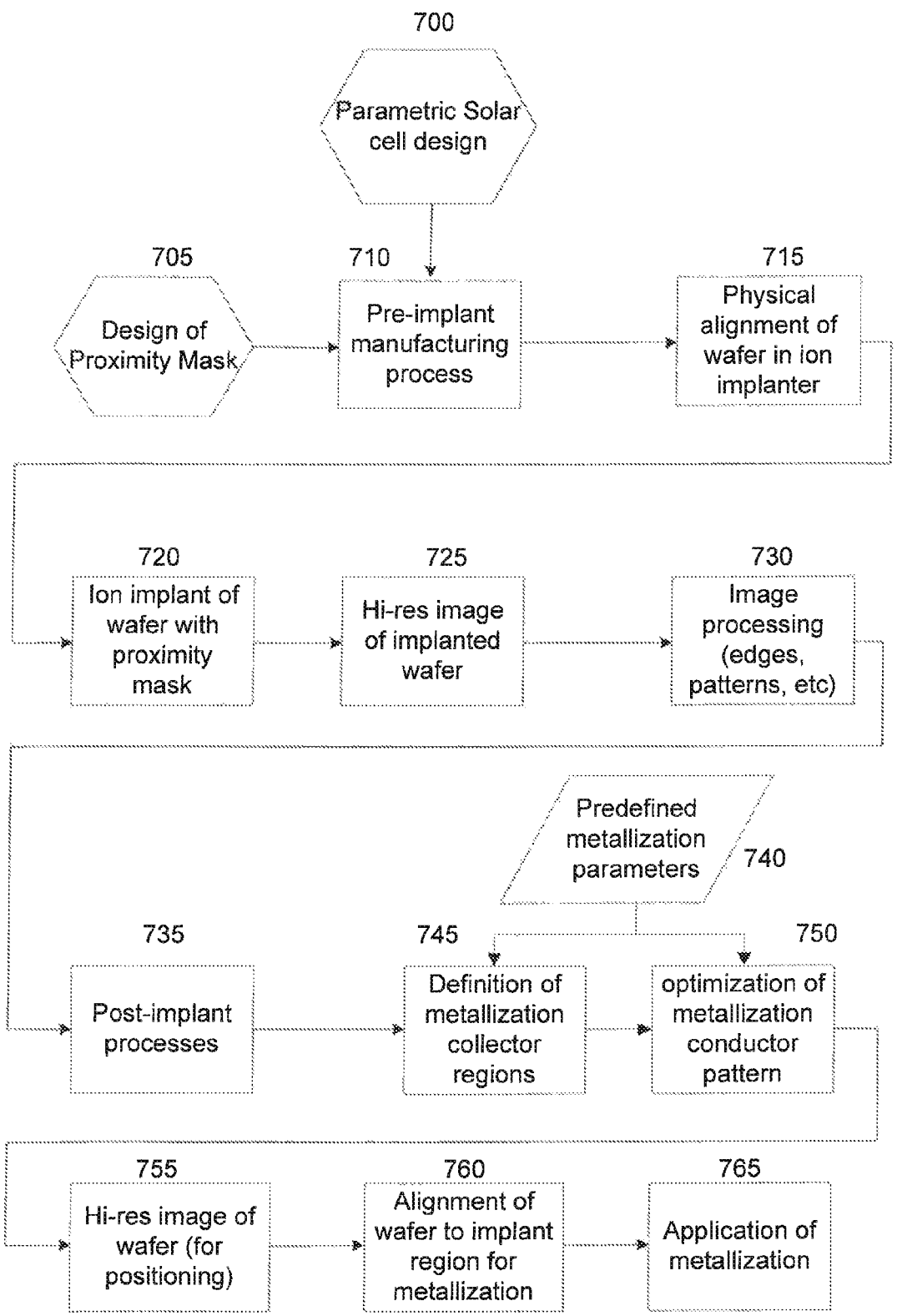
FIG. 7A is a flowchart of the manufacturing process in accordance with one embodiment.

FIG. 7A shows a flowchart of one embodiment. Similar to the current processes, the parametric solar cell design is completed (step 700). In some embodiments, a metallization pattern is also generated at this time. The design of a matching proximity mask, based on the solar cell pattern is also created (step 705). These two components are used in pre-implant manufacturing processes (step 710). The wafer is then aligned in the ion implanter (step 715). This alignment need not be as precise as the alignment in the prior art (step 430). In the prior art, the subsequent processing steps were all based on alignment to known indicia or fiducials. Therefore, it was critical that all processes be tightly aligned to these indicia, to minimize variation. However, in the present embodiment, the subsequent steps are based on the indicia and the high-resolution image of the implanted regions. Thus, any variation in position of the implanted region with respect to the indicia or fiducials can be captured and compensated for later in the process.

In step 720, the wafer is implanted by the ion implanter with the proximity mask located in front of the wafer. This implantation step creates the implanted regions onto which the metal is to be applied. It should be noted that other methods of selectively implanting the wafer may also be used. For example, other methods such as sheath engineering, modulation of the ion beam, and movement of the workpiece during ion implantation, can also be used to create a implant pattern in the wafer.

After implantation, an image, such as a high-resolution image, of the implanted wafer is obtained (step 725). This high resolution image can be obtained by any suitable means, including a CCD camera, electron beam (SEM), Auger Emission spectroscopy, an infrared camera, a photodiode, secondary ion mass spectroscopy (SIMS), surface contact resistance, photoluminence, a laser (such as Thermawave) or other systems. Thus, the term "image" is used to describe the pattern which indicates the relative placement of the implanted regions on the wafer, regardless of the means used to generate that pattern.

The high resolution image is then processed to determine the edges of the implanted regions, and to determine the overall pattern of the implanted region (step 730). The high-resolution image may be associated with the wafer, such as through an identifier and other characterizing mark. The image is processed by a computing device or controller. The controller has a processing unit, capable of executing instructions, and a memory device. The memory device typically contains computer readable and executable instructions, as well as other information. The executable instructions comprise the metallization algorithm. The memory may contain both volatile and non-volatile portions. The controller may include other functions, such as input/output ports, sensors, and other devices.

This information is then supplied to a metallization algorithm to define the specific shape of the metal pattern for this particular wafer. Such an algorithm is typically executed on a controller or computing device. The algorithm may be executed on the same controller as used for the image processing. In other embodiments, a different controller is utilized for the metallization algorithm.

The resulting data may be stored in a database, associated with the wafer identification. In this way, subsequent process steps can query the database to determine the appropriate measurements and setting to be used with a particular wafer.

After the high resolution image has been taken, the wafer is then subjected to post-implant processes (step 735).

Figure 1:
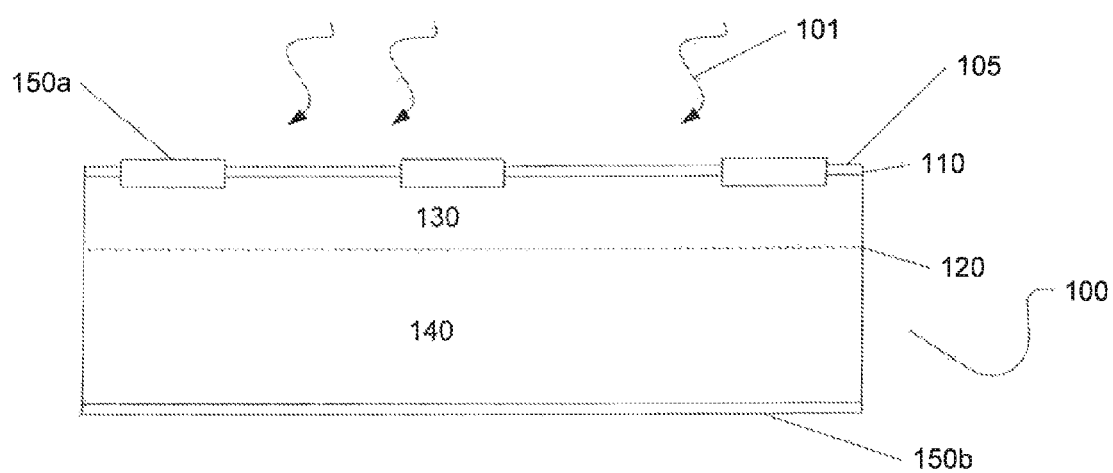
FIG. 1 shows a cross section of a solar cell of the prior art.
Figure 2:
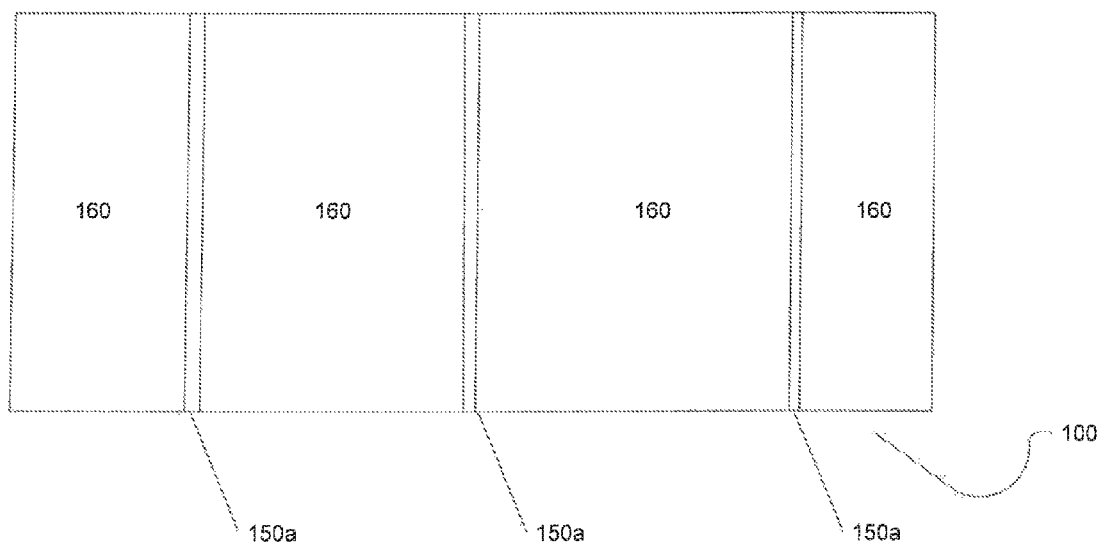
FIG. 2 shows a top view of the solar cell of FIG. 1.
Figure 3:
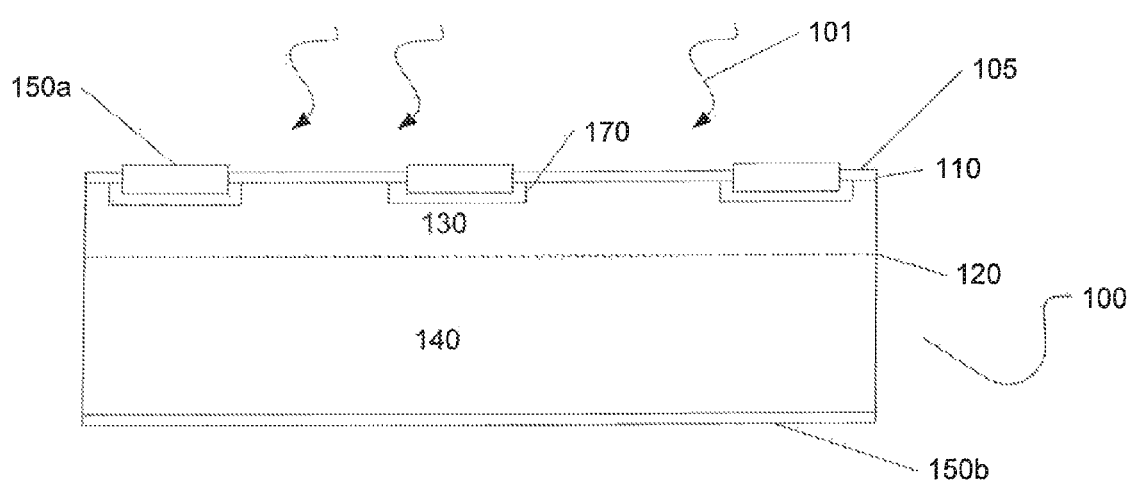
FIG. 3 shows a cross section of a solar cell using selective emitter design.
Figure 4:
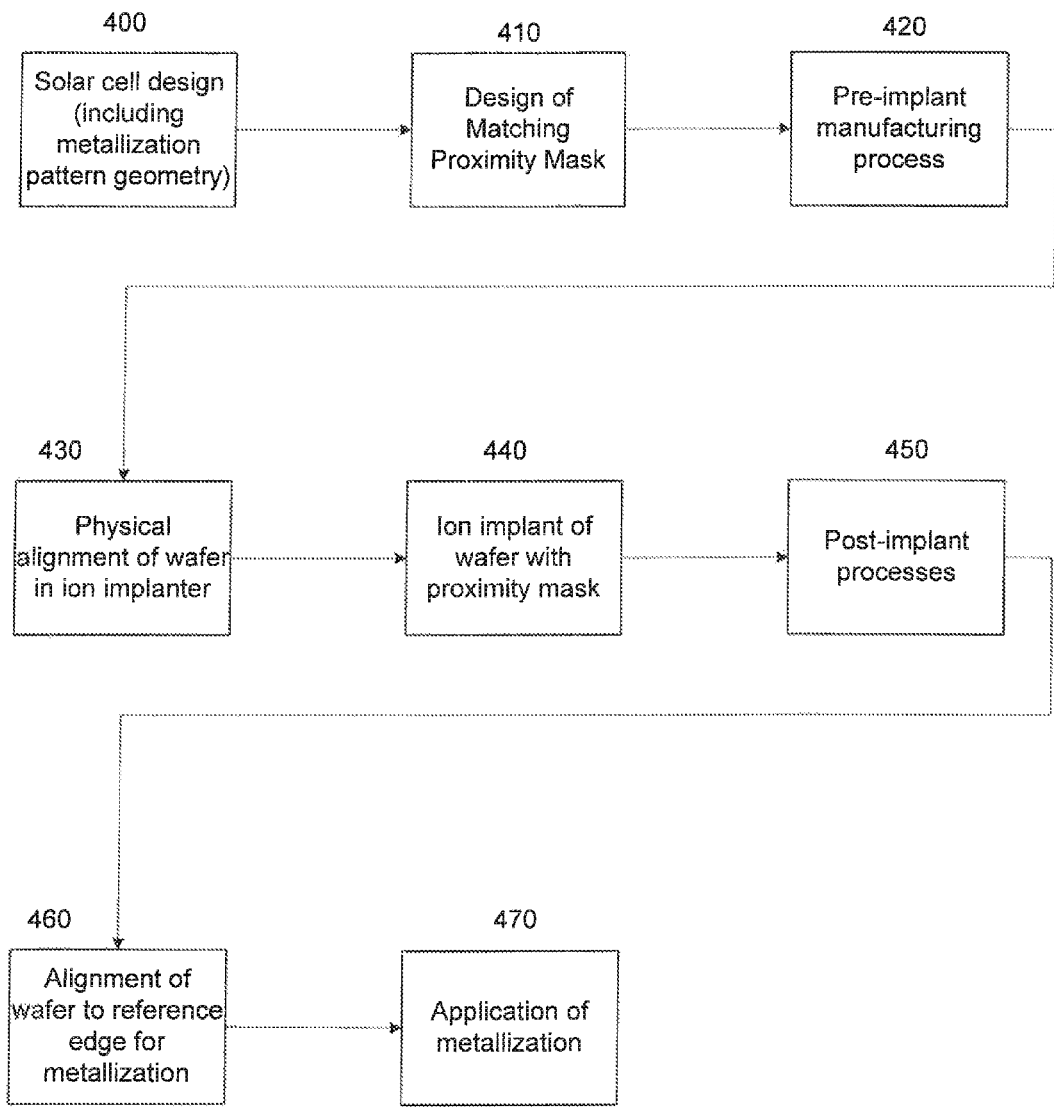
FIG. 4 shows a production flowchart of the prior art.
Figure 5:
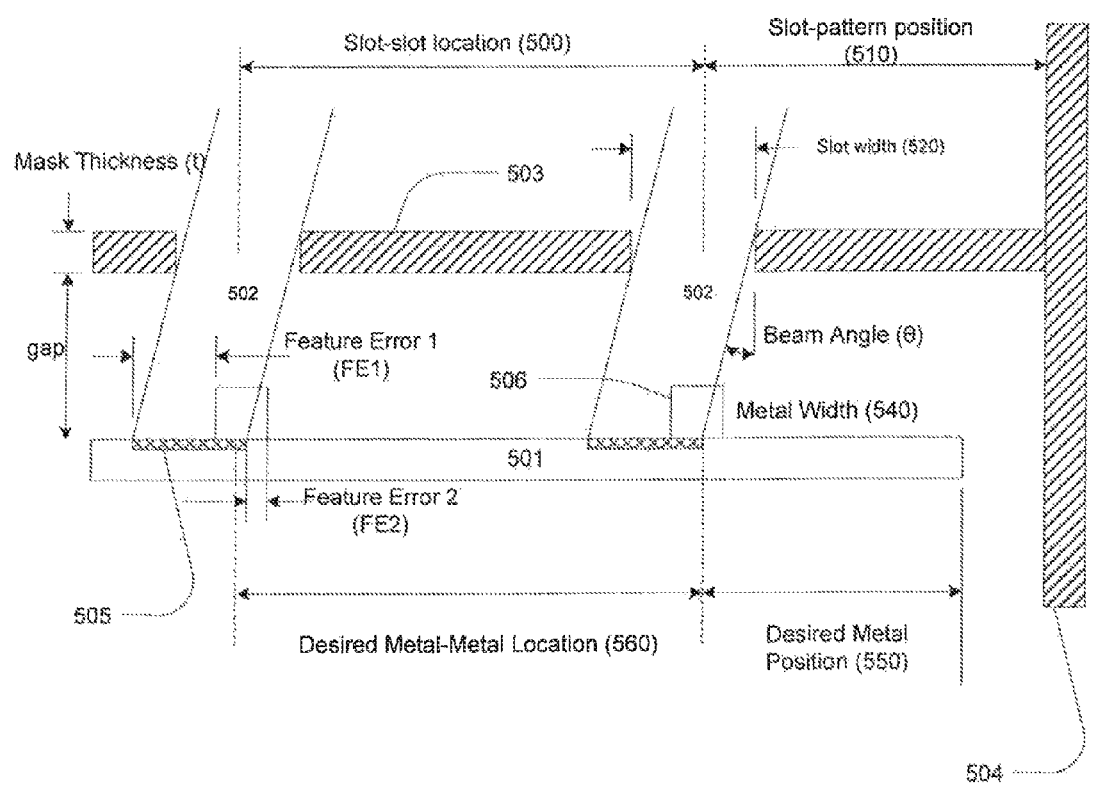
FIG. 5 shows the sources of inaccuracy with a proximity mask.

The metallization algorithm determines the specific shape of the metal pattern. In some embodiments, the metal pattern is determined to altering the parameters of a pre-existing pattern (step 745). In this embodiment, the algorithm utilizes the predefined metallization parameters (step 740) as a initial draft of the metal pattern. Based on the image processing, the algorithm may increase or decrease certain predetermined parameters. For example, the width of the metal layer may be altered based on the actual measured thickness of the implanted regions. Similarly, metal-metal location 560 (see FIG. 5) may be altered based on actual placement of the implanted regions.

Figure 8:
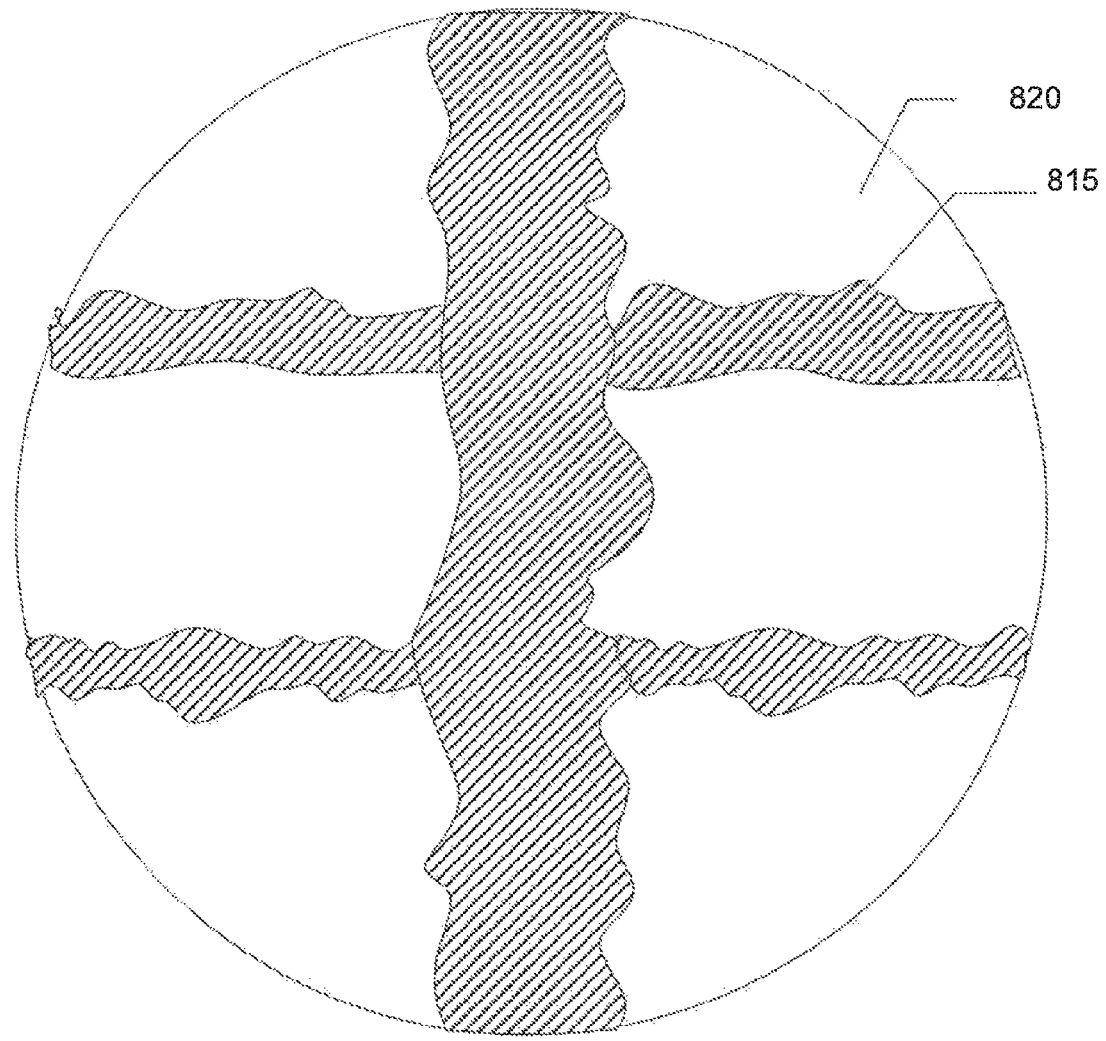
FIG. 8 is an expanded view of an implanted wafer.
Figure 9:
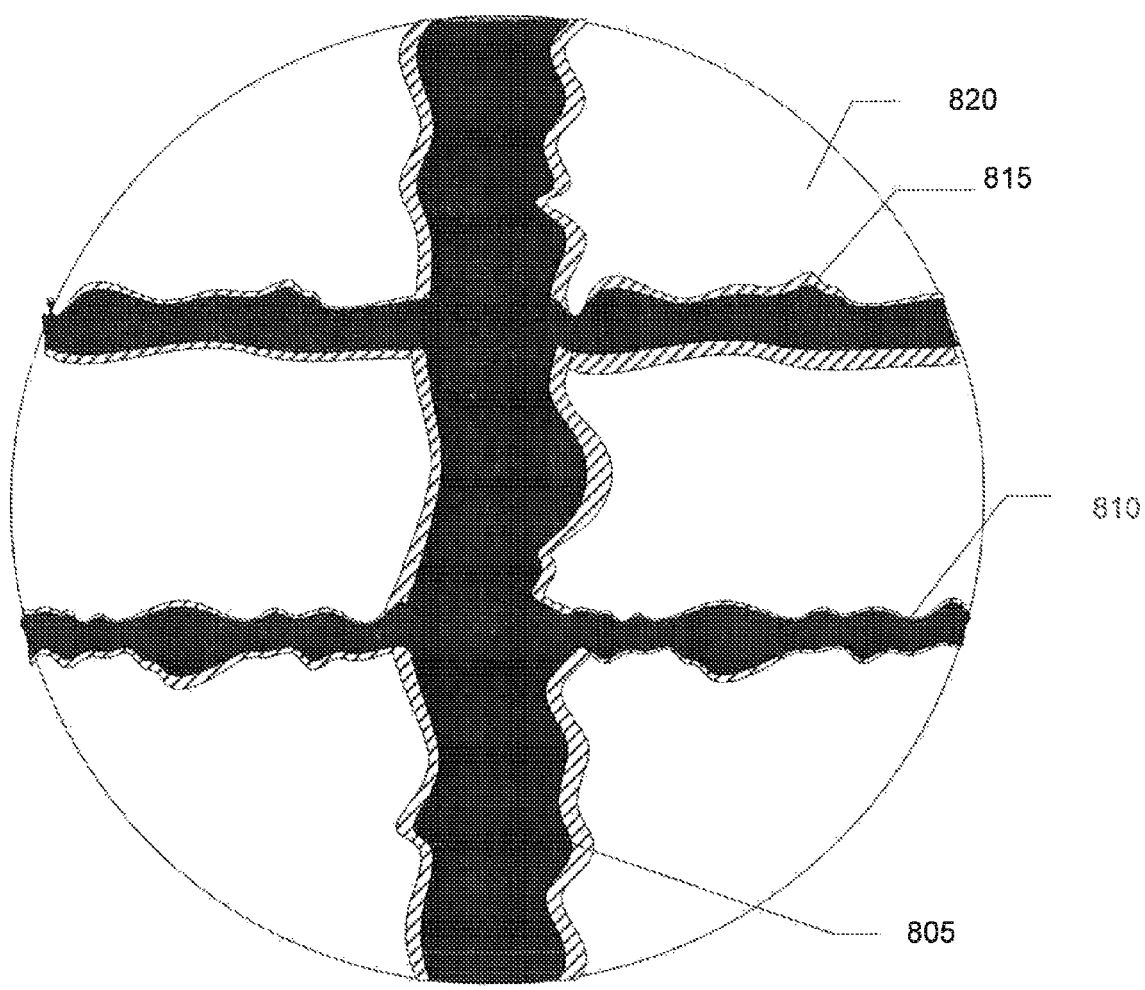
FIG. 9 is the wafer of FIG. 8 with a metal layer applied.

In other embodiments, the metallization algorithm creates a new metal pattern by offsetting the edges of the implant region (step 750). FIG. 8 shows an expanded view of a portion of the top surface of a solar cell, after the wafer has been implanted (step 720). At this point in the process, implanted regions 815 have been created amid emitter region 820. The high resolution image determines the outline of the implanted regions 815 and creates a metallization layer, based on the actual size and shape of the implanted regions 815. In some embodiments, the metal layer is made slightly thinner than the underlying implanted regions 815 to allow for tolerances and inaccuracies in the alignment process. A metal layer, such as that shown in FIG. 9, is then created by the algorithm, and is subsequently applied.

Figure 7B:
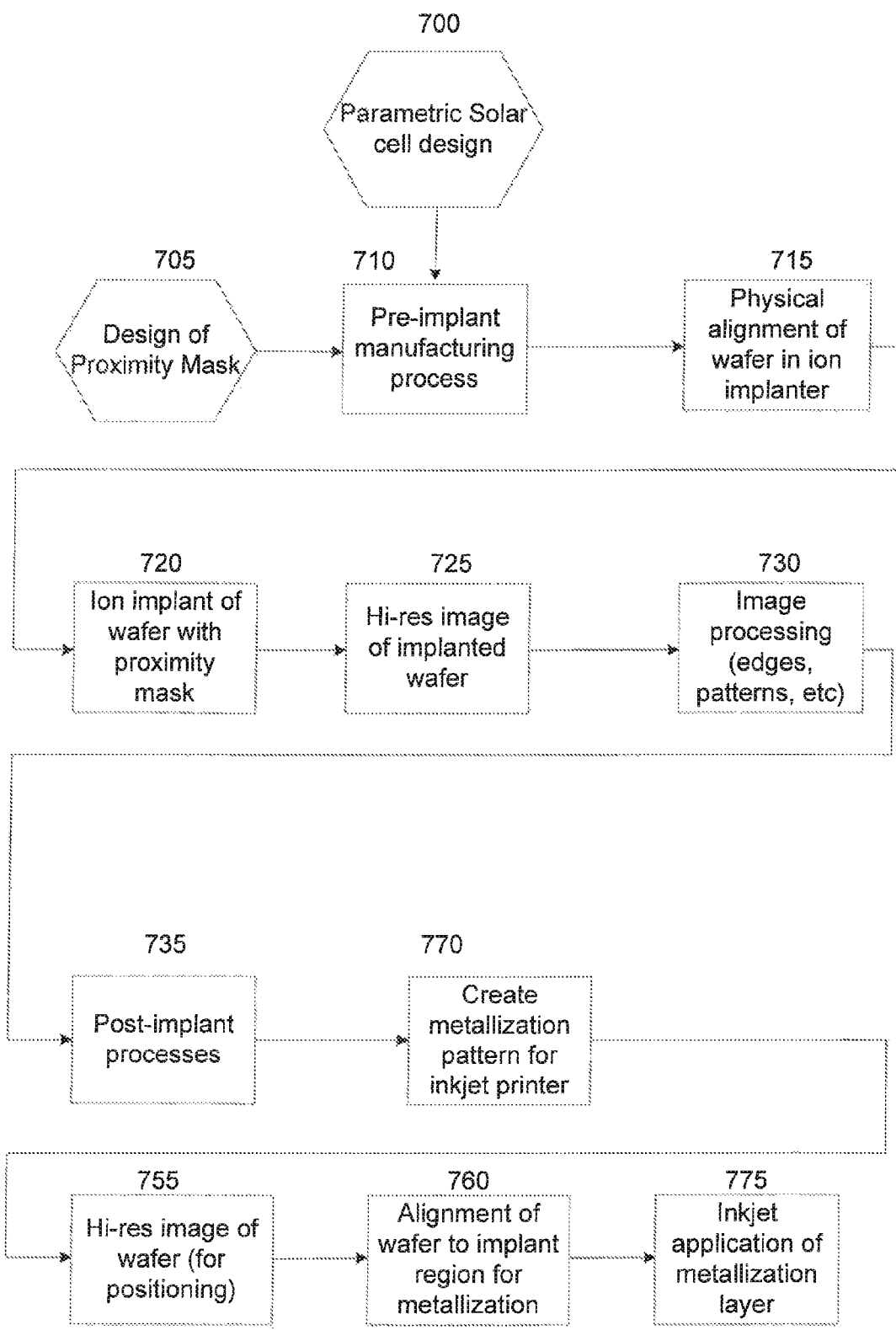
FIG. 7B is a flowchart of the manufacturing process in accordance with a second embodiment.

In other embodiments, as shown in FIG. 7B, the metal layer is deposited through the use of inkjet printing technology. Ink jet printers eject modulated droplets of liquid through an array of nozzles onto a surface, such as a surface of a solar cell 100. The nozzles may be controlled by, for example, a piezo electric motor or other methods known to those skilled in the art. The surface may be scanned across this array of nozzles, though the array of nozzles may be scanned as well. The pattern used by the inkjet printer can be created based on the high resolution image taken in step 725. Based on the image, a metallization pattern for the inkjet printer can be created, as shown in step 770. In this way, the inkjet nozzles can deposit metal exactly on top of the implanted regions, as shown in FIG. 9.

Figure 6A:
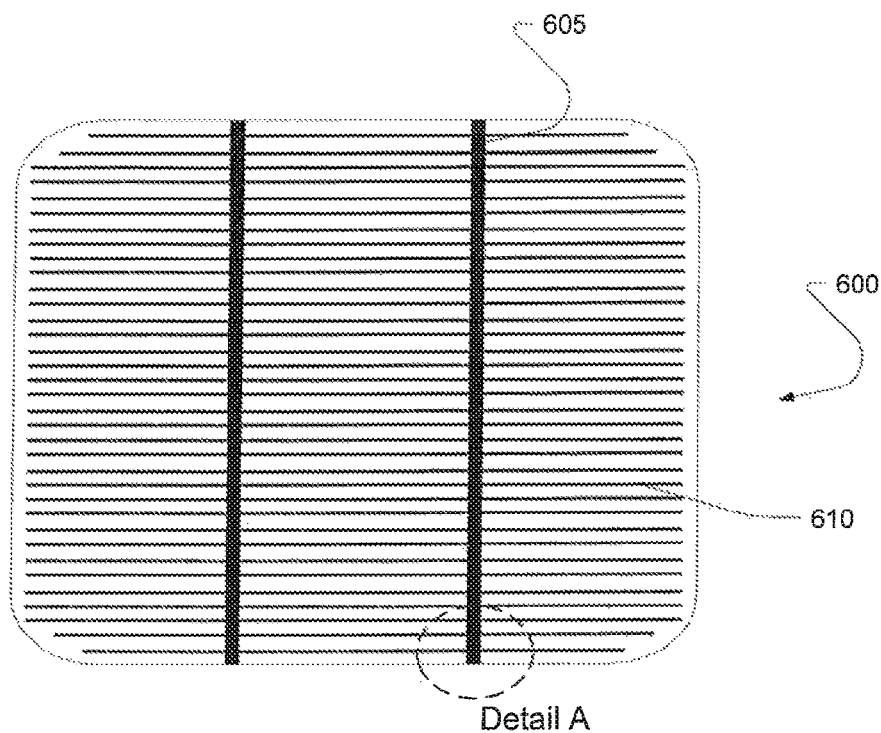
FIGS. 6A-C show the relative widths and positions of implanted regions and metal layers according to the prior art.
Figure 6B:
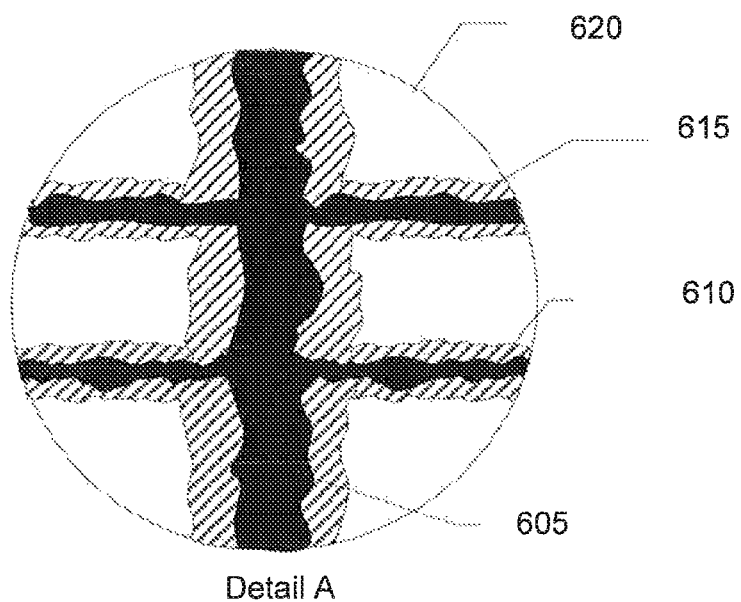

Regardless of the method used, the metal layers are typically applied later in the production process. It may therefore be necessary to re-align the wafer to its initial position (from step 720). To do this, the wafer may be uniquely identified, such as by using position or characterizing marks on the wafer. Returning to FIG. 7A-B, a second image is taken of the wafer (step 755) to obtain its position. In some embodiments, its position is measured relative to a fixed indicia or fiducial. The wafer is then aligned to the indicia to return it to the exact location that it was in during the initial implant (step 760). These steps may be performed by a positioning system comprising an optical sensor and a motion control stage. Having determined and adjusted the position of the wafer, the wafer is then printed with a metal paste using a suitable method (step 765). The most commonly used method is screen printing. Ink jet printing, as shown in FIG. 7B, may also be used a non-contact printing method, which improves wafer yield due to less breakage, as shown in step 775. Aerosol sprays may also be used. FIG. 9 shows the wafer after the metal layer 805, 801 have been applied. Note that the ratio of the width of the metal layer to the width of the implanted region is much greater than was possible in the prior art (see FIG. 6B). In the prior art, implanted regions having a width of 500 μm are used in conjunction with 110 μm metal lines. This is a ratio of about 20%. Using present printing methods, the placement of the metal line may be controlled to about 15 μm. Thus, for a 110 μm metal line, the implanted region only needs to be about 140 μm to guarantee that the metal line is applied atop the implanted region. Similarly for a 40 μm metal line, the implanted region only needs to be about 70 μm. The ratio of these widths varies with the desired metal line width and can be greater than 50%. In the case of 110 μm metal lines, this ratio can be greater than 75%.

The tolerance of the placement of the metal lines limits the ratio that can be achieved. As described above, currently, the placement of the metal lines can be controlled to about 15 μm. Thus, the width of the metal line, added to twice this tolerance establishes the minimum width for the implanted region. Thus, as the placement tolerances are reduced, the ratio of metal line width to implanted region width can be increased.

Although this process has been described in conjunction with selective emitter designs, the disclosure is not limited to this embodiment. As described above, interdigitated back contact (IBC) solar cells contain heavier patterned implanted regions on the back side of the wafer. The above technique could be used to determine the exact location, width and shape of the p+ and n+ doped regions. Based on the images, metal layers for each can be generated using the techniques described above (steps 745 and 750). These metal patterns can then be applied to the back side of the IBC solar cell.

In addition, this process has been described in conjunction with a proximity mask. However, this method can also be used with other methods of selective implantation, such as sheath engineering. In all cases, the implanted region is detected and the subsequent application of the metallization layer is modified based on the actual location of the implanted regions.

Figure 10:
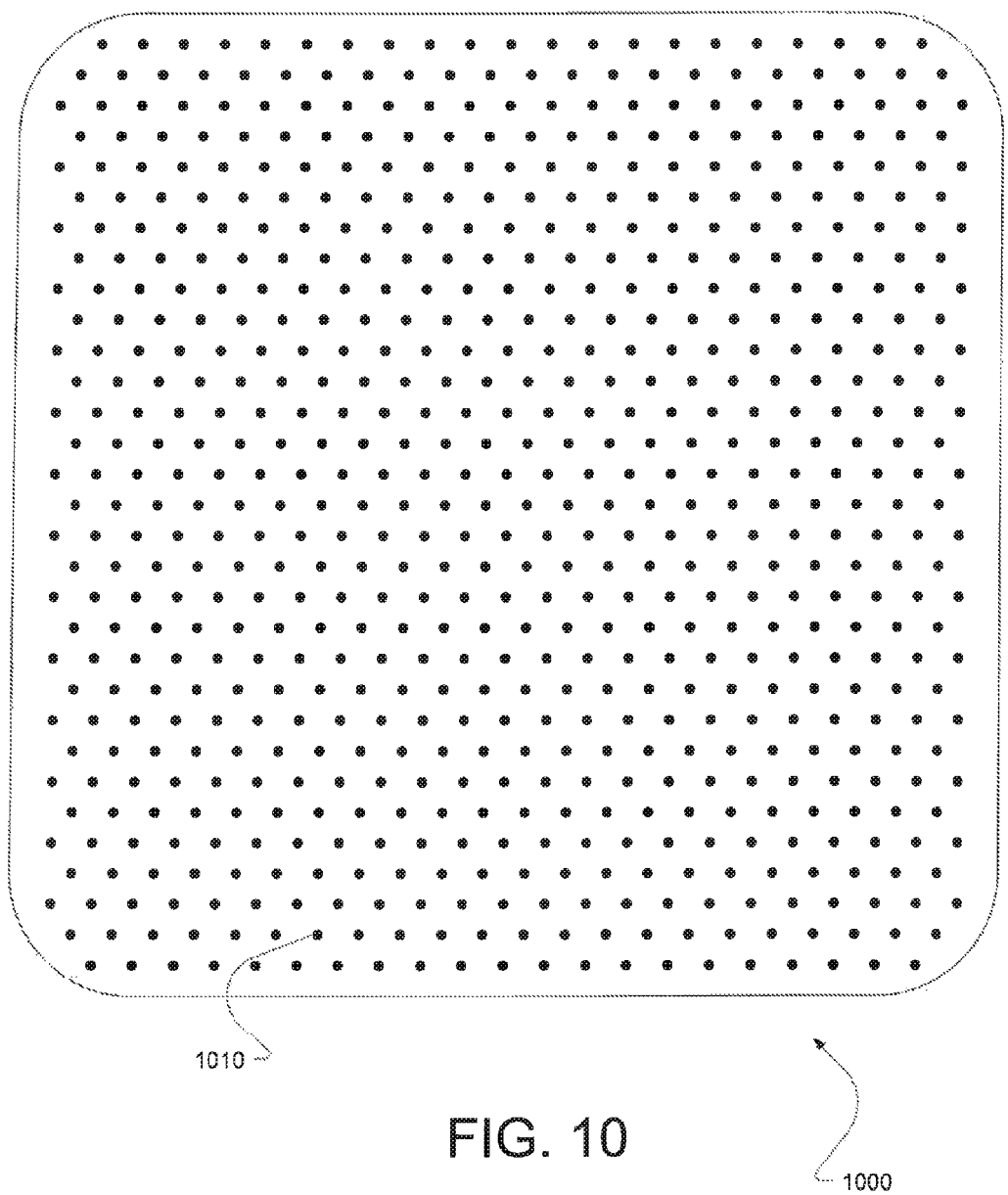
FIG. 10 is a dot collector grid for a solar cell.

Although some embodiments of solar cells use a pattern that includes busbars and fingers, other configurations are also possible. FIG. 10 shows the top surface of a solar cell 1000. In this embodiment, implanted regions 1010 are circular or nearly circular and arranged in a grid. For this selective emitter type application, the collector dots (i.e. implanted regions) are n++ implants (for a phosphorus implant). Typically there would also be a blanket emitter of n+ type. Although FIG. 10 shows the implanted regions 1010 forming a regularly shaped and spaced grid, any arrangement of implanted regions is possible. In this configuration, the metal layer comprises two components; the collector dots, which overlay the implanted regions 1010, and the interconnects which connect the various collector dots together.

The size, shape and location of the metal collectors can be created using the process described above. In this way, the metal collectors can be formed so as to occupy as much of the implanted region as possible.

In addition to dot collectors on the top surface, this technique can also be used on the back side of the solar cell. For example, a dot collector may be used on the back side to create a back-surface field.

Figure 6C:
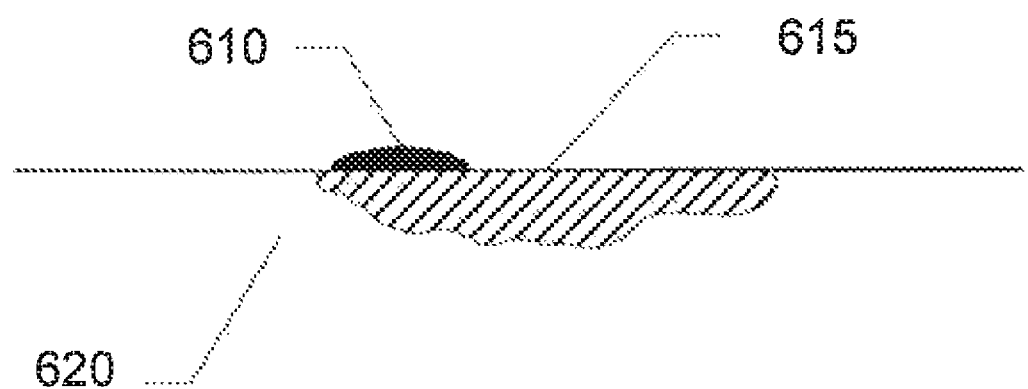

In addition to creating the metal collector pattern, the high resolution image can be used for other purposes. Unlike the configuration of FIG. 6, the implanted regions can be connected in a variety of ways. For example, the metal collectors can be connected using a tree-like structure, where individual collectors are linked by very thin wires (due to the limited amount of current being passed). As individual collectors are linked, the metal collections become thicker, to accommodate the increased current load.

Figure 11:
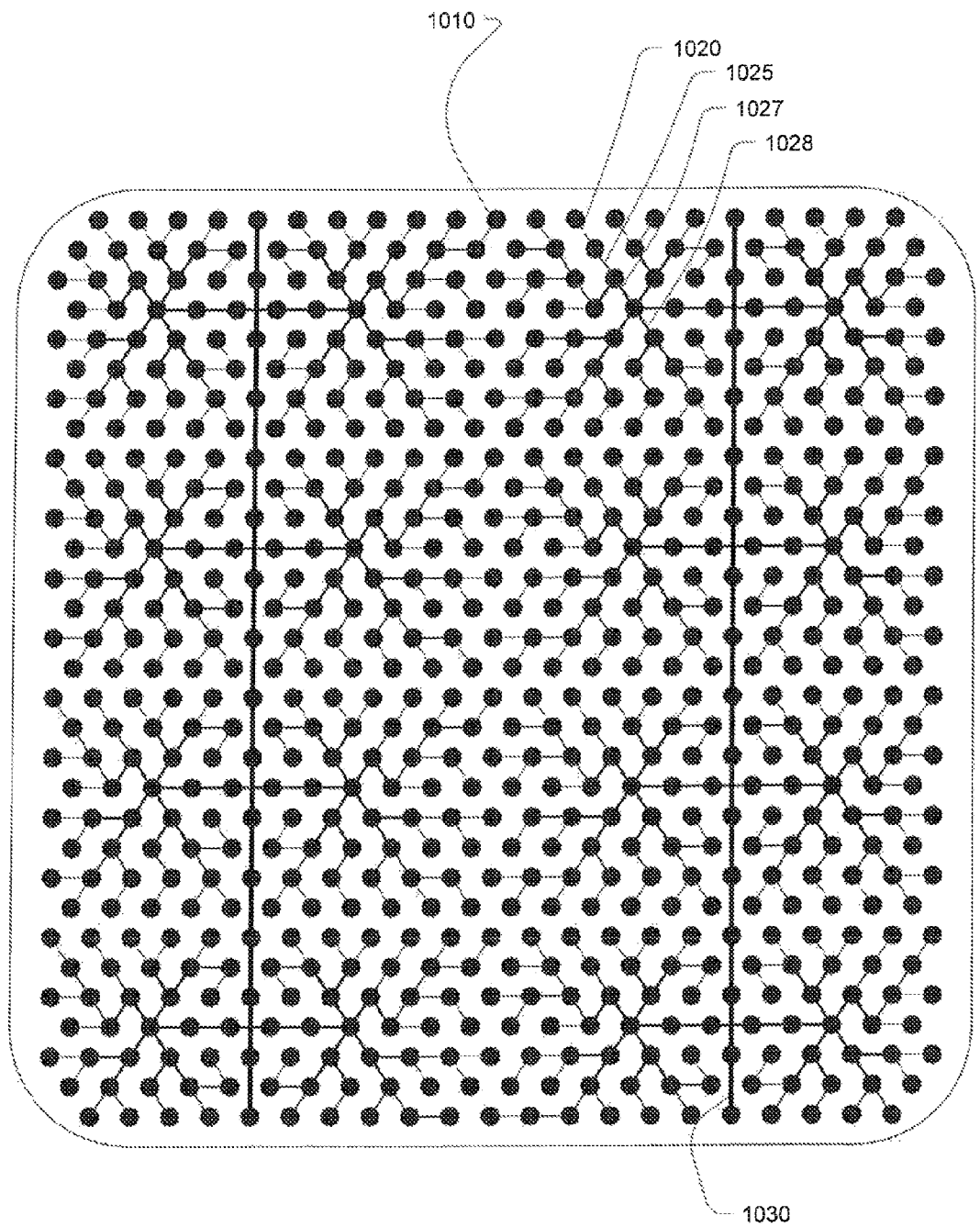
FIG. 11 is the solar cell of FIG. 10 with metal linkages applied.

FIG. 11 shows an example of a dot collector solar cell, where the metal collectors 1010 are connected using metal wires. Note that wires which connect a single collector (i.e. 1020) are very thin, as the current is very low from a single collector. As the currents from a plurality of collectors are linked, the metal connections need to increase in size as well. Linkage 1020 connects a single collector, and therefore is very thin. Linkage 1025 connects two collectors and is therefore slightly thicker. Linkages 1027, 1028 are progressively thicker due to the increase load through them. Ultimately, all of the collectors are connected to a busbar 1030.

Smaller metal linkages (i.e. 1020) have a higher series resistance relative to their presented shadow. A dot pattern selective emitter can be designed to increase the current to increasingly larger linkages (i.e. 1027, 1028) while simultaneously minimizing the number of linkages in the network. Based on the actual pattern of implanted regions, the algorithm can optimize the placement and thickness of the linkages connecting the metal collectors. The controller makes these adjustment based on predetermined control parameters, governed by the actual metal placement accuracy and other physical and electrical characteristics.

For example, a mask may create a first dot pattern. After the high resolution pattern has been created, a dynamic optimizing software program determined the location and size of each dot. Based on this, the software program can generate an optimal set of linkages.

Over time, various effects can cause this optimized linkage pattern to change.

For example, if the screen used for the implantation process is slightly offset relative to the wafer, all of the implanted dots will be correspondingly offset. Since this is a change that affects all of the dots in a uniform manner, the optimal linkage pattern may not need to be changed. However, each of the dots and linkages may also be correspondingly offset.

In another example, if the screen used for the implantation process is tilted, the placement and size of the dots may be affected. Assume the screen is tilted such that it is closer to the wafer on the left side. Since the screen is closer to the wafer on this side, the implanted dots will tend to be smaller as the beam expands less after passing through the screen. A tilt also affects the placement of the dots, bringing them closer together. Thus, a tilted screen may affect both the size and location of the dots. Since the effect may not be uniform across the entire wafer, the optimal linkage may change.

In another example, if the screen wears out or warps, the implanted pattern will be affected. Often, this type of wear out affects the implanted pattern in a non-uniform way. Therefore, the optimal linkages may change as a result of screen wearout.

By utilizing the high resolution image of the implanted regions to create an optimized linkage pattern, several benefits are achieved. First, there is greater tolerance as to the alignment of the mask to the wafer during implantation. Secondly, since imperfections due to mask wear out can be compensated for, the useful life of the mask can be increased.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of applying a metallization layer to a substrate comprising:
    implanting ions into a portion of said substrate so as to create a plurality of implanted regions;
    using a detection system to determine an actual location of said implanted regions;
    using said actual location to generate a metallization pattern comprising a plurality of collectors;
    applying said metallization pattern to said substrate such that said metallization pattern covers a portion of said implanted regions; and
    using said actual location to design a pattern of linkages to connect said collectors, wherein said pattern of linkages is designed to minimize a number of said linkages based on said actual location.

2. The method of claim 1, further comprising processing said substrate so as to produce a solar cell.

3. The method of claim 1, wherein said linkages comprise a plurality of widths.

4. The method of claim 1, further comprising applying said linkages to said substrate.

5. A method of applying a metallization layer to a substrate comprising:
    implanting ions into a portion of said substrate so as to create a plurality of implanted regions;
    using a detection system to determine an actual location of said implanted regions;
    using said actual location to generate a metallization pattern comprising a plurality of collectors and linkages between said collectors;
    applying said metallization pattern to said substrate such that said metallization pattern covers a portion of said implanted regions, wherein said metallization pattern is designed to minimize a number of said linkages based on said actual location.

6. The method of claim 5, further comprising processing said substrate so as to produce a solar cell.

7. The method of claim 5, wherein said linkages comprise a plurality of widths.

* * * * *